(12) United States Patent
Ahmed et al.

(10) Patent No.: US 11,997,928 B2
(45) Date of Patent: May 28, 2024

(54) APPARATUS AND METHOD FOR GENERATING POWER WITH A THERMOELECTRIC GENERATOR, PASSIVE BURNER, AND PASSIVE HEAT SINK

(71) Applicant: GTI ENERGY, Des Plaines, IL (US)

(72) Inventors: Abdelallah Ahmed, Thousand Oaks, CA (US); John C. Vega, III, Camarillo, CA (US); Jeffrey A Mays, Woodland Hills, CA (US); David F. Morrison, II, Hesperia, CA (US)

(73) Assignee: GTI ENERGY, Des Plaines, IL (US)

( * ) Notice: Subject to any disclaimer, the term of this patent is extended or adjusted under 35 U.S.C. 154(b) by 0 days.

(21) Appl. No.: 17/845,338

(22) Filed: Jun. 21, 2022

(65) Prior Publication Data
US 2022/0406984 A1    Dec. 22, 2022

Related U.S. Application Data

(60) Provisional application No. 63/213,483, filed on Jun. 22, 2021.

(51) Int. Cl.
| | |
|---|---|
| *H10N 10/13* | (2023.01) |
| *F23D 14/10* | (2006.01) |
| *F23M 20/00* | (2014.01) |
| *H10N 10/17* | (2023.01) |

(52) U.S. Cl.
CPC ............. *H10N 10/13* (2023.02); *F23D 14/10* (2013.01); *F23M 20/00* (2015.01); *H10N 10/17* (2023.02); *F23M 2900/13003* (2013.01)

(58) Field of Classification Search
CPC ....................................................... H02S 10/30
See application file for complete search history.

(56) References Cited

U.S. PATENT DOCUMENTS

| | | | |
|---|---|---|---|
| 1,744,453 A | 1/1930 | Dressler | |
| 3,056,848 A | 10/1962 | Meyers | |
| 3,150,656 A | 9/1964 | Huber | |
| 3,428,496 A * | 2/1969 | Addis | H10N 10/00 136/208 |
| 2013/0340802 A1* | 12/2013 | Jovovic | H10N 10/13 136/201 |
| 2018/0151791 A1* | 5/2018 | Mays | H10N 10/17 |
| 2018/0331271 A1* | 11/2018 | Imran | F01K 25/02 |

* cited by examiner

*Primary Examiner* — Daniel P Malley, Jr.
(74) *Attorney, Agent, or Firm* — Pauley Erickson & Swanson

(57) ABSTRACT

An integrated combustor-thermoelectric generator and method for producing electrical power and/or for operating a pneumatic or electric device. The apparatus includes a burner tube, a tubular heat exchanger extending along and around the burner tube, a plurality of thermoelectric generators disposed along sides of the heat exchanger, and a heat sink on an opposite side of the thermoelectric generators from the burner and heat exchanger. The thermoelectric generators can be paired with an electric valve or a DC air compressor for operating a pneumatic device by directing heated gases from the combustor through the heat exchanger to thermoelectric couples and/or modules for powering the air compressor. The thermoelectric generator and DC compressor can be installed to a natural gas source at a well pad for operating a pneumatic device at the well pad.

18 Claims, 3 Drawing Sheets

APPARATUS AND METHOD FOR GENERATING POWER WITH A THERMOELECTRIC GENERATOR, PASSIVE BURNER, AND PASSIVE HEAT SINK

CROSS REFERENCE TO RELATED APPLICATION

This application claims the benefit of U.S. Provisional Patent Application Ser. No. 63/213,483, filed on 22 Jun. 2021. The provisional application is hereby incorporated by reference herein in its entirety and is made a part hereof, including but not limited to those portions which specifically appear hereinafter.

GOVERNMENT SUPPORT CLAUSE

This invention was made with government support under award number DE-FE0029060 awarded by the Depailinent of Energy. The government has certain rights in the invention.

BACKGROUND OF THE INVENTION

Field of the Invention

This invention relates to power generation, and more particularly, provides a method and apparatus for generating power and subsequent pneumatic or other action through a thermoelectric generator device.

Description of Related Art

Gas and oil field operation constitutes one of the more significant sources of greenhouse gas (GHG) emissions. Methane emissions are a significant issue due to the Greenhouse Gas Intensification factor and the amount of methane that is produced. A major gas leakage source is emissions from natural gas operated pneumatic devices. Approximately 30-35% of all production related emissions in the U.S. come from pneumatic controllers. There are between 500,000 and 600,000 wells that utilize intermittent pneumatic controllers in the U.S. There is thus a continuing need for improved power and air sources for remote well head pneumatic devices.

SUMMARY OF THE INVENTION

This invention relates to a process and apparatus that relies on fugitive or other gas to produce electrical power. Embodiments of this invention include or use a high efficiency thermoelectric generator (TEG) apparatus. The TEG system can be implemented for oil and gas field applications, and operated on fugitive gas to produce electrical power. The TEG apparatus provides a portable power system that can be used, without limitation, for operating pneumatic devices and/or other loads.

The general object of the invention can be attained, at least in part, through an apparatus for producing electric power. The apparatus includes a burner, a thermoelectric generator (TEG) disposed along the burner, and a heat sink on an opposite side of the thermoelectric generator from the burner. The burner desirably includes a tube of appropriate size and shape, wherein a pressure of a fuel within the tube inducts air to create an inflammable fuel/air mixture within the tube. The mixture exits the tube through a plurality of burner holes, where the mixture is burned and naturally aspirated.

In embodiments of this invention, the burner is disposed within a heat exchanger. The heat exchanger is configured to allow air to naturally flow from a bottom to feed the combustion process and includes exchanger holes on a top to vent hot gases. As the gases are burnt and vented, the heat exchanger absorbs energy to increase temperature to the TEG.

In embodiments, one or more TEGs are placed adjacent an external surface of the heat exchanger. A plurality of thermoelectric generators are preferably sandwiched between the heat exchanger and the heat sink, wherein a temperature difference across the thermoelectric generator between the hotter heat exchanger and the cooler heat sink causes the thermoelectric generator to produce an electrical current for further work purposes.

In embodiments, the heat sink includes heat pipes and/or fins, such as connected to or through a cooling unit. The heat pipes can extend along or through a side of the thermoelectric generator opposite the burner. The cooling unit can include the cooling fins on external surfaces.

The invention further includes an apparatus for producing electric power, including a burner tube and a tubular heat exchanger extending along and around the burner tube. A plurality of thermoelectric generators are disposed along sides of the heat exchanger. A heat sink is disposed on an opposite side of the thermoelectric generators from the burner and heat exchanger, wherein a temperature difference across the thermoelectric generators between the hotter heat exchanger and the colder heat sink causes the thermoelectric generators to produce a useable electrical current. A pressure of a fuel within the burner tube inducts air to create an inflammable fuel/air mixture within the tube, and the mixture exits the tube through a plurality of burner holes, where the mixture is burned and naturally aspirated within the tubular heat exchanger. The heat exchanger includes air intake holes on a first side, is configured to allow air to naturally flow from the intake holes to feed a combustion process. The heat exchanger includes vent holes on a second side to vent hot gases, and the heat exchanger absorbs energy from the combustion process to increase temperature.

In embodiments, the tubular heat exchanger comprises a square tube, and the thermoelectric generators are disposed along an external surface of a third side and, preferably also an opposite fourth side of the heat exchanger.

The invention further includes a method of generating electrical power. The method includes: providing a fuel to a burner; directing heated gases from the burner to a heat exchanger; creating a temperature difference across a plurality of thermoelectric generators between the heat exchanger and a heat sink.

The invention further includes a method of operating a device. The method includes: providing a fuel to a burner; directing heated gases from the burner to a heat exchanger; creating a temperature difference across the plurality of thermoelectric generators between the heat exchanger and a heat sink; and powering the device with the thermoelectric couples and/or modules to operate the device (e.g., an electric valve/actuator, or a compressor/pneumatic device). The power generated can also be stored in a battery system.

The thermoelectric generators of embodiments of this invention include a plurality of thermoelectric modules and/or couples disposed (e.g., axially) along at least one side, and preferably two opposing sides, of the heat exchanger to convert the combustion heat into electrical energy. Each of the modules and/or couples includes a hot side shoe adjacent and desirably in contact with outer surface of heat exchanger, and a cold side shoe disposed away from the burner/heat exchanger. The thermoelectric modules and/or couples and the corresponding section of the heat exchanger can be insulated with, for example, microporous or nanoporous type insulation materials. Heat pipes or other cooling elements preferably aid in reducing the temperature at the cold shoe. The insulation material can be placed around/between the heat pipes.

The heat for the TEG is provided by the burner to provide power (e.g., ~25 We) for remote gas and oil wellhead instrument air or other suitable power needs. Embodiments provide an instrument air system that is sufficiently low-cost to enable rapid adoption by the oil and gas industry for the retrofit of existing natural gas powered pneumatic devices. The apparatus and method of this invention enables operating pneumatic devices with air or electric valves and eliminates gas emissions while providing an economically attractive and secure alternative.

In addition to reducing emissions, the proposed system has several beneficial attributes: (1) simple, reliable, and low-cost for retrofitting into numerous gas wells operating in the U.S.; (2) scalable to lower power (e.g., 25 We) as required for a majority of gas well operations, (3) reliable and robust unattended operation in widely distributed and remote areas; (4) secure profile for deployment that is less prone to theft at these remote sites than other technologies; and/or (5) high efficiency and low cost that directly translates to increased recoverable revenue.

Other objects and advantages will be apparent to those skilled in the art from the following detailed description taken in conjunction with the appended claims and drawings.

DESCRIPTION OF THE INVENTION

This invention relates to a process and apparatus that uses fugitive or other gas to produce electrical power. The apparatus is intended to be used in locations where combustible fuels are available, there is a need for electrical power, and an electrical grid is not accessible. The invention desirably uses the electrical power to produce work, such as to drive an electric actuator or valve, or for producing compressed air that will be used to actuate pneumatic valves at natural gas well heads.

Embodiments of this invention include a design that is passive, which makes the apparatus more robust and efficient. Simplicity makes it less expensive, and generally easier to handle and assemble.

Embodiments of this invention include or use a high efficiency thermoelectric generator (TEG) apparatus. The TEG system can be implemented for oil and gas field applications, and operated on fugitive gas to produce electrical power. The TEG apparatus provides a portable power system that can be used, without limitation, for operating electric and/or pneumatic devices.

In embodiments of this invention, the apparatus for producing electric power includes a passive burner, one or more thermoelectric generators, and one or more passive heat sinks. The burner is desirably of a tubular design, which uses the pressure of the fuel to induct air to create an inflammable fuel/air mixture in the tube. This partial premix significantly minimizes soot formation and increases combustion efficiency. The mixture exits the tube through numerous holes (e.g., along opposing burner tube sides) where it is burned and naturally aspirated. A spark igniter can be used to start the combustion. The tubular burner is placed inside a heat exchanger. The heat exchanger is designed to allow air to naturally flow from a bottom to feed the combustion process and includes holes on a top to vent hot combustion products. As the gases are burnt and vented, the heat exchanger absorbs the energy to increase temperature. A plurality of thermoelectric generators are placed on or otherwise along the outside of the heat exchanger. The thermoelectric generators are sandwiched or otherwise between the heat exchanger and passive heat sinks which desirably include heat pipes and fins. This causes a temperature difference across the thermoelectric generator (hot heat exchanger and cold heat sink) which causes them to produce an electrical current.

Figure 1:
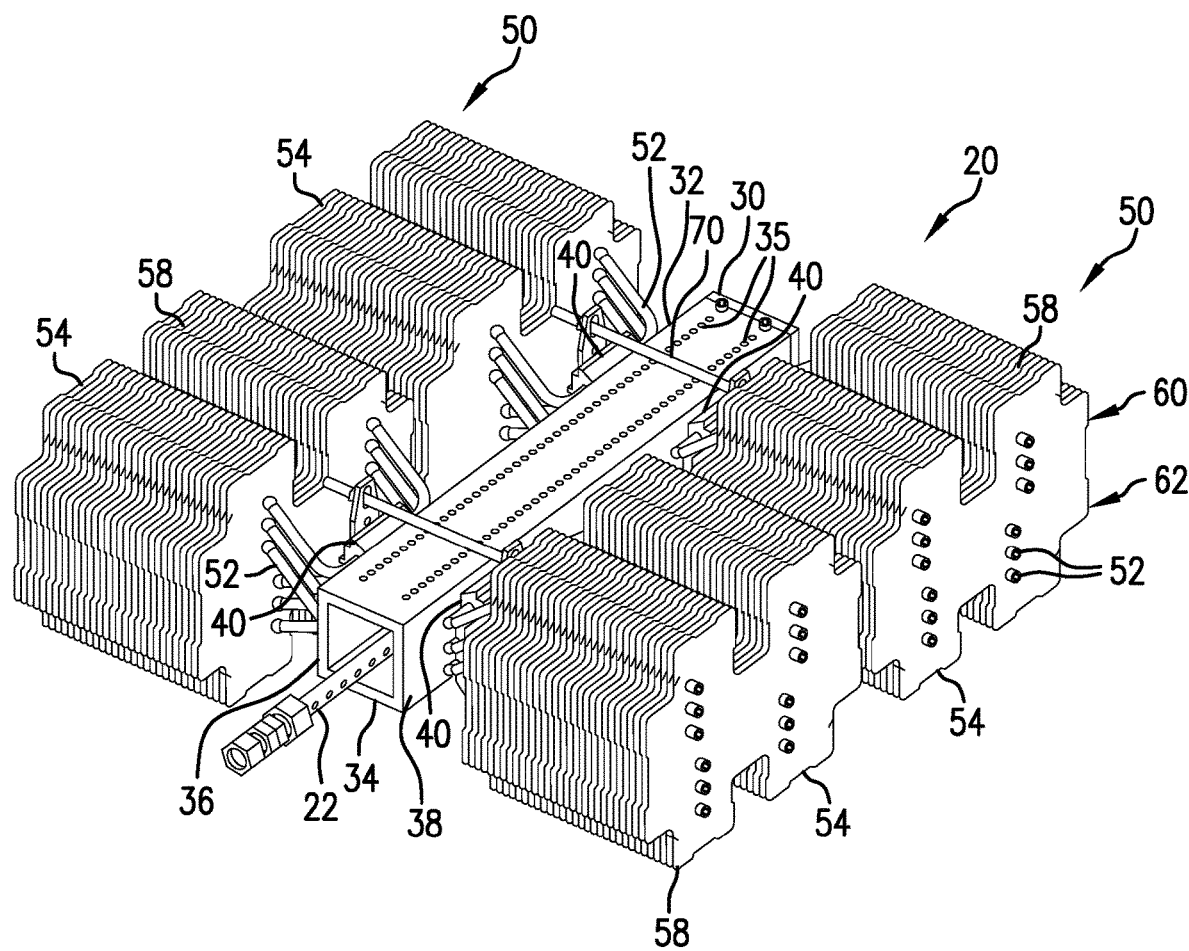
FIG. 1 is a perspective view of an apparatus according to one embodiment of this invention.
Figure 2:
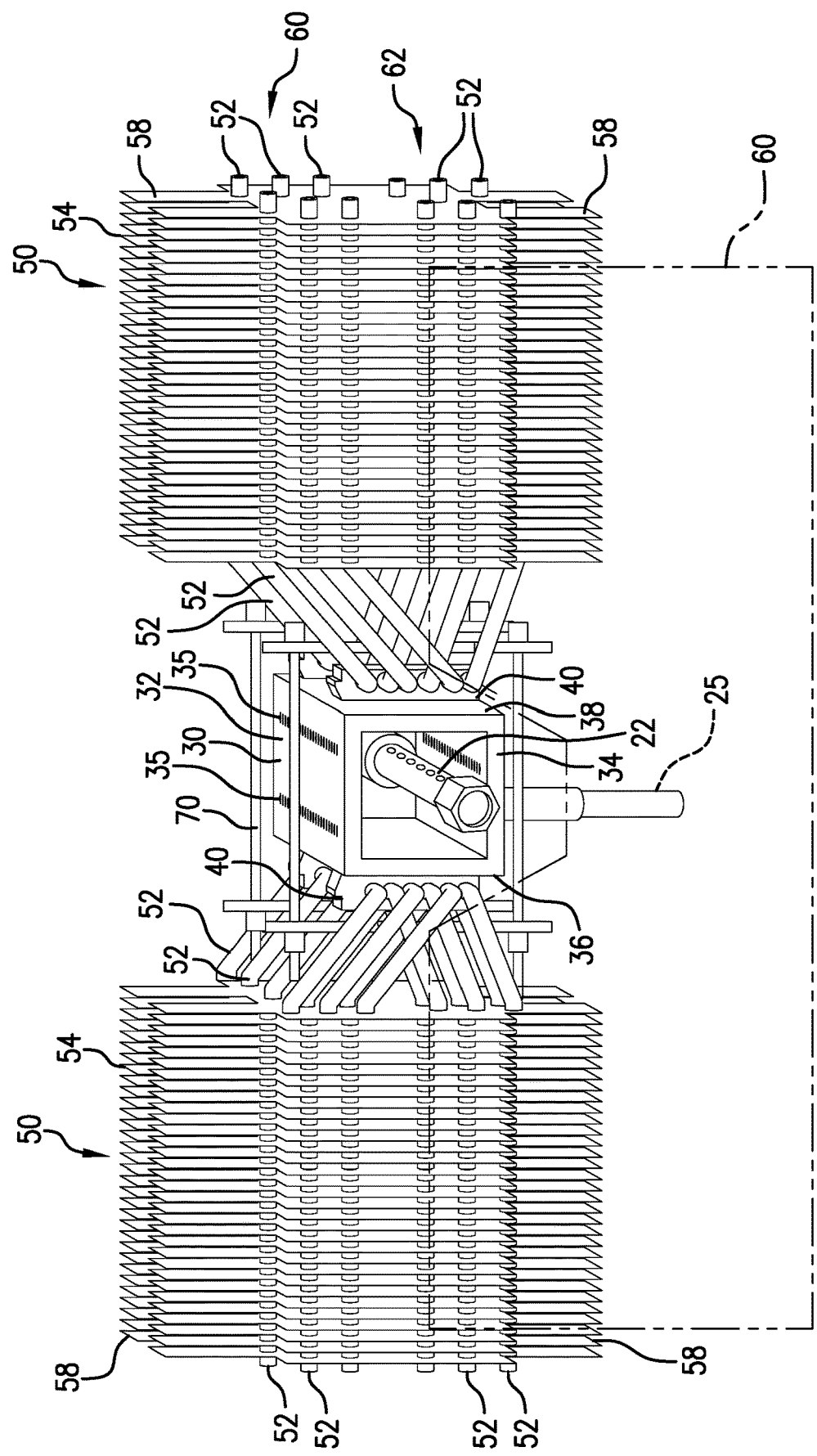
FIG. 2 is an end view of the apparatus of FIG. 1, further including additional installation components.

FIG. 1 shows an apparatus 20 according to one embodiment of this invention. A tubular burner 22 (e.g., cylindrical) extends within, without limitation as to shape, a rectangular tube heat exchanger 30. The heat exchanger 30 includes a plurality of through openings 35, shown on a first side 32, as extending in two parallel lines, along a top/upper surface of the heat exchanger 30. The openings 35 vent hot gases and improve heat absorption. The opposing bottom surface 34 can be configured with similar or different openings, or any other configuration to allow air flow to the burner. As shown in FIG. 2, the heat exchanger is open at one end to receive the fuel line and/or burner tube, and closed at the opposite end.

Four thermoelectric generators (TEG) 40 are disposed adjacent, against, or otherwise on outer side surfaces 36, 38 of the heat exchanger 30. The thermoelectric generators 40 are between the heat exchanger 30 and a corresponding heat sink 50 (e.g., one, two, three, four, etc. on each side 36, 38 of the HX 30). The temperature difference across the thermoelectric generators 40 between the hot heat exchanger 30 and the (relatively) cold heat sink 50 causes the thermoelectric generators 40 to produce an electrical current.

The heat sink 50 of the illustrated embodiment includes a plurality of heat pipes 52 connecting to the thermoelectric generators 40. As better shown in FIG. 2, the heat pipes 52 desirably extend through the cold side shoe of the thermoelectric generators 40, and at each end extending from the thermoelectric generators 40, extending through a further heat sink cooling unit 54. The cooling unit is desirably "passive" in that no there are no moving elements for the coiling heat sink process.

In embodiments of this invention, a base plate clamps the heat pipes 52 to the corresponding TEG 40. The base plate is desirably formed of two heat conductive pieces to sandwich the heat pipes 52. The heat pipes of embodiments of this invention are copper tubing sealed at both ends and filled with copper powder and a liquid (e.g., water) in a partial vacuum. The water evaporates as it absorbs heat, and as the vapor travels the length of the pipe it transfers heat energy to the entirety of the pipe (and then to fins, etc. discussed below). This causes the vapor to condense and the liquid water travels back to the TEG heat source through the copper powder by capillary effect.

As shown, the cooing units 54 include CPU coolers 56 with a plurality of outwardly extending fins 58. The fins 58 are any suitable metal, such as aluminum with punched holes to press fit over the heat pipes. As illustrated, there are six heat pipes 52 extending through and from each side of each TEG 40, with three pipes 52 angled upwards into an upper section 60 the cooling unit 54, and three angled downward to a lower section 62 of the coolers 56. Also, as illustrated, the angle of the heat pipes 52 on each side of the TEG 40 alternate (one up, one down, etc.).

FIG. 2 further shows an optional wind shield 60 for the burner 22, and an example burner tube configuration including igniter leads 25. The ignition system can be powered by a battery, charged by the TEG power production. Additional features not illustrated include, without limitation, an insulation material adjacent the heat exchanger sides 36, 38 and around the heat pipes, rain covers, and bug screens, depending on need. A support structure or frame 70 extends between the cooling units 54, and can be used to attach the device to other components, such as shown in FIG. 3.

The device and methods of this invention are useful for generating electrical power. Embodiments of this invention include a method of operating a pneumatic device, such as by the generated electrical power. The method includes providing a fuel to a burner; directing heated gases from the burner to a heat exchanger; creating a temperature difference across the plurality of thermoelectric generators between the heat exchanger and a heat sink; and powering an air compressor with the thermoelectric couples and/or modules to operate the pneumatic device.

Figure 3:
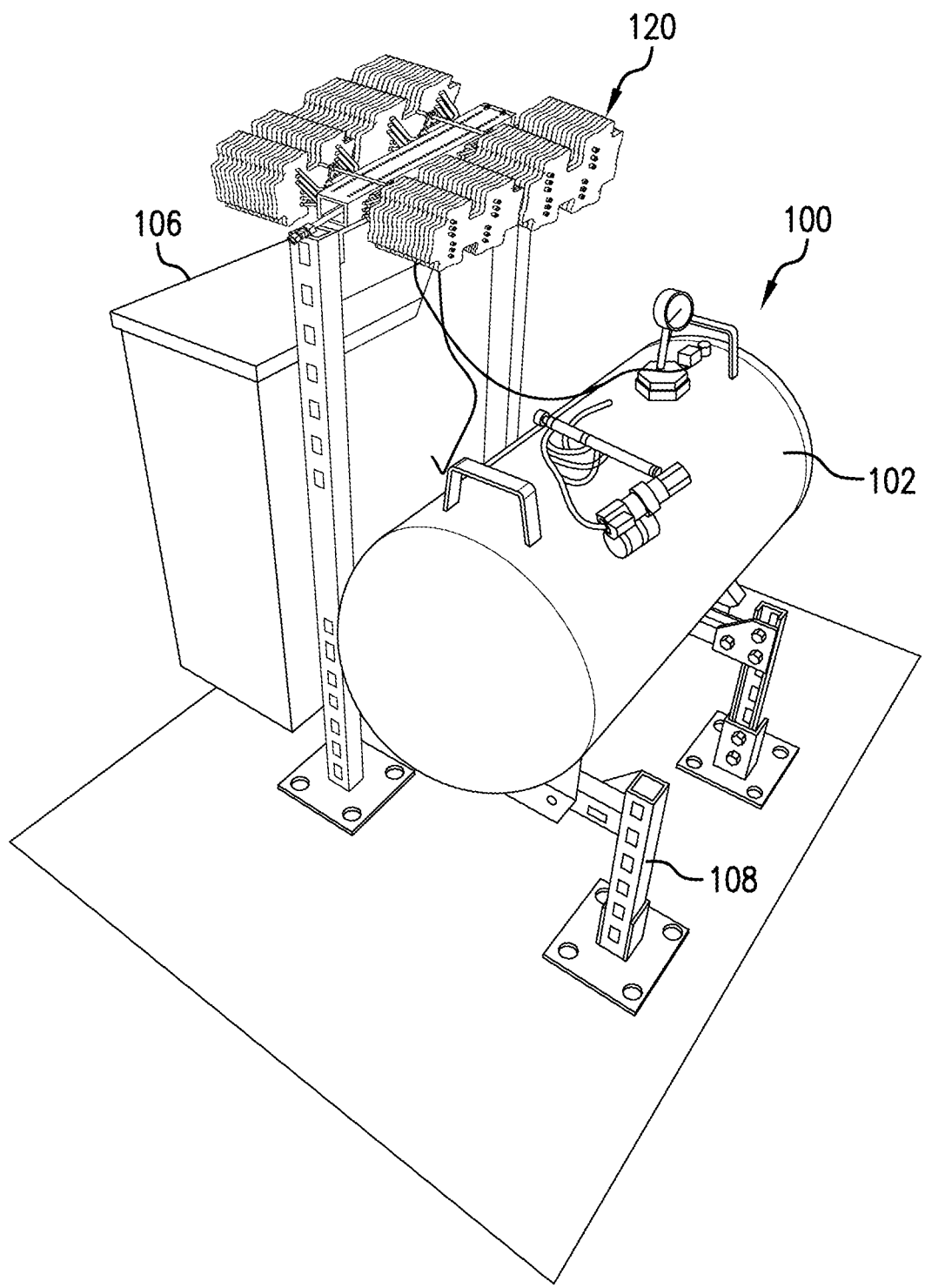
FIG. 3 shows an installation for the apparatus of this invention, according to one embodiment of this invention.

FIG. 3 illustrates the apparatus of this invention, such as discussed in FIGS. 1 and 2, implemented in a pneumatic device control system 100. The apparatus 120 is associated with a compressor and air tank 102 to power the compressor to create and store compressed air for use. A control cabinet 106 houses the compressor, a suitable control system and other operational components, such as valves, regulators, batteries, etc., as needed. The apparatus 120 provides electrical power to operate the compressor to provide an air supply in the tank 102 (e.g., two weeks' worth of air pressure) to further provide pneumatic power to a pneumatic device, such as at a wellhead. All components are mounted to a central frame 108, to which other environmental shielding (e.g., rain cover, bug shields, etc.) can also be attached.

Thus the invention provides an improved method and apparatus for generating power and pneumatic action through a thermoelectric generator device. The device is of particular use at remote installations, such as natural gas wellheads. As will be appreciated, various sizes, shapes, and configuration of all components of the devices and installations of this invention can vary, depending on need.

The invention illustratively disclosed herein suitably may be practiced in the absence of any element, part, step, component, or ingredient which is not specifically disclosed herein.

While in the foregoing detailed description this invention has been described in relation to certain preferred embodiments thereof, and many details have been set forth for purposes of illustration, it will be apparent to those skilled in the art that the invention is susceptible to additional embodiments and that certain of the details described herein can be varied considerably without departing from the basic principles of the invention.

What is claimed is:

1. An apparatus for producing electric power, comprising:
   a burner, wherein the burner comprises a horizontal burner tube;
   a tubular heat exchanger extending along and around the burner tube, wherein the heat exchanger is configured to allow air to naturally flow from a bottom to feed a combustion process and includes exchanger holes on a top to vent hot gases, and as the gases are burnt and vented, the heat exchanger absorbs energy to increase temperature;
   a thermoelectric generator disposed along a side of the heat exchanger; and
   a heat sink on an opposite side of the thermoelectric generator from the burner.

2. The apparatus of claim 1, wherein a pressure of a fuel within the burner tube inducts air into the burner tube to create an inflammable mixture of fuel and air within the burner tube.

3. The apparatus of claim 2, wherein the mixture exits the burner tube through a plurality of burner holes extending along sides of the burner tube, where the mixture is combusted within the tubular heat exchanger.

4. The apparatus of claim 1, wherein the thermoelectric generator is placed adjacent an external surface of the heat exchanger.

5. The apparatus of claim 1, wherein the thermoelectric generator is one of a plurality of thermoelectric generators each sandwiched between the heat exchanger and the heat sink, wherein a temperature difference across the thermoelectric generator between the heat exchanger and the heat sink causes the thermoelectric generator to produce an electrical current.

6. The apparatus of claim 1, wherein the heat sink comprises heat pipes and fins, wherein the heat pipes extend along or through a side of the thermoelectric generator opposite the heat exchanger, and each of opposing ends of the heat pipes extend through the fins.

7. The apparatus of claim 1, wherein the heat sink comprises heat pipes that extend along or through a side of the thermoelectric generator opposite the burner.

8. The apparatus of claim 7, wherein the heat pipes extend between the thermoelectric generator and a cooling unit.

9. The apparatus of claim 8, wherein the cooling unit comprises cooling fins.

10. The apparatus of claim 1, wherein the heat sink comprises a heat pipe and a cooling unit, wherein the heat pipe extends along or through a side of the thermoelectric generator opposite the heat exchanger, and each of the opposing ends of the heat pipe extend into the cooling unit.

11. An apparatus for producing electric power, comprising:
    a burner tube;
    a tubular heat exchanger extending along and around the burner tube, wherein the heat exchanger includes air intake holes on a first side, is configured to allow air to naturally flow from the intake holes to feed a combustion process, and the heat exchanger includes vent holes on a second side to vent hot gases, and the heat exchanger absorbs energy from the combustion process to increase temperature;
    a plurality of thermoelectric generators disposed along sides of the heat exchanger; and
    a heat sink on an opposite side of the thermoelectric generators from the burner and heat exchanger, wherein a temperature difference across the thermoelectric generators between the heat exchanger and the heat sink causes the thermoelectric generators to produce an electrical current.

12. The apparatus of claim 11, wherein a pressure of a fuel within the burner tube inducts air to create an inflammable mixture of fuel and air within the burner tube, and the mixture exits the burner tube through a plurality of burner holes, where the mixture is burned and naturally aspirated within the tubular heat exchanger.

13. The apparatus of claim 11, wherein the thermoelectric generators are disposed along an external surface of a third side of the heat exchanger.

14. The apparatus of claim 11, wherein the tubular heat exchanger comprises a square tube, and the thermoelectric generators are disposed along an external surface of a third side and an opposite fourth side of the heat exchanger.

15. The apparatus of claim 11, wherein the heat sink comprises heat pipes that extend along or through a side of each of the thermoelectric generators opposite the heat exchanger, wherein the heat pipes extend between the thermoelectric generators and a cooling unit, wherein the cooling unit comprises cooling fins.

16. A method of operating a device, the method comprising:
    providing a fuel to a burner comprising a horizontal burner tube;
    directing heated gases from the burner to a tubular heat exchanger extending along and around the burner tube, wherein the heat exchanger includes air intake holes on a first side, is configured to allow air to naturally flow from the intake holes to feed a combustion process, and includes vent holes on a second side to vent hot gases, and the heat exchanger absorbs energy from the combustion process to increase temperature;
    creating a temperature difference across a plurality of thermoelectric generators disposed along sides of the heat exchanger and between the heat exchanger and a heat sink; and
    powering the device with the thermoelectric generators to operate the device.

17. The method of claim 16, further comprising storing generated power from the thermoelectric generators in a battery, and powering an air compressor via the battery.

18. The method of claim 17, wherein the device is a pneumatic device or an electric valve.

* * * * *